(12) United States Patent
Iizuka et al.

(10) Patent No.: US 6,563,149 B2
(45) Date of Patent: May 13, 2003

(54) SOLID-STATE IMAGING DEVICE

(75) Inventors: Takayuki Iizuka, Kanagawa (JP); Mitsuru Yamashita, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/100,827

(22) Filed: Mar. 19, 2002

(65) Prior Publication Data

US 2002/0130321 A1 Sep. 19, 2002

(30) Foreign Application Priority Data

Mar. 19, 2001 (JP) ........................................ 2001-078506

(51) Int. Cl.$^7$ ........................ H01L 33/00; H01L 27/148
(52) U.S. Cl. ........................ 257/222; 257/233; 257/443
(58) Field of Search ........................ 257/222, 233, 257/443

(56) References Cited

U.S. PATENT DOCUMENTS 5,569,938 A * 10/1996 Shoda et al.
6,002,145 A * 12/1999 Niisoe

FOREIGN PATENT DOCUMENTS

EP 0241886 A1 * 10/1987

* cited by examiner

Primary Examiner—Stephen D. Meier
(74) Attorney, Agent, or Firm—Sonnenschein, Nath & Rosenthal

(57) ABSTRACT

Signal charges generated by a plurality of photoelectric conversion elements are transferred to first and second horizontal charge transfer registers via corresponding vertical charge transfer registers. The first and second horizontal charge transfer registers transfer the signal charges to first and second output portions, respectively. The first and second output portions convert the signal charges into voltages. The first and second output portions respectively include first and second signal charge detectors, first and second transistors each having a source, a drain, and a gate, and first and second charge sweeping regions, each having a charge sweeping control gate and a charge sweeping drain. The first signal charge detector, the source, the drain, and the gate of the first transistor, and the charge sweeping control gate and the charge sweeping drain of the first charge sweeping region are almost congruent to the second signal charge detector, the source, the drain, and the gate of the second transistor, and the charge sweeping control gate and the charge sweeping drain of the second charge sweeping region, and the former components are overlaid almost completely on the latter components by a translational movement.

7 Claims, 5 Drawing Sheets

SOLID-STATE IMAGING DEVICE

BACKGROUND OF THE INVENTION

1. Field of the Invention

The present invention relates to solid-state imaging devices.

2. Description of the Related Art

FIG. 1 is a plan view illustrating an example of a known solid-state imaging device. In a solid-state imaging device 102 shown in FIG. 1, a plurality of photoelectric conversion elements 106 are disposed in a matrix with a gap therebetween on a photodetector region 105 of a silicon semiconductor substrate 104. A vertical charge transfer register 108 having a charge coupled device (CCD) structure is disposed for each column of the photoelectric conversion elements 106 in the vertical direction (indicated by the arrow V in FIG. 1 of the photoelectric conversion elements 106. A horizontal charge transfer register 110 also having a CCD structure is disposed at one side of the individual vertical charge transfer registers 108 in the horizontal direction (indicated by the arrow H in FIG. 1) of the photoelectric conversion elements 106. An output portion 112 is formed at one end of the horizontal charge transfer register 110.

In the above-configured solid-state imaging device 102, upon receiving light, signal charges are generated by each column of the photoelectric conversion elements 106, and are supplied to the corresponding vertical charge transfer register 108 via a read area (not shown) which intervenes between the photoelectric conversion elements 106 and each of the vertical charge transfer registers 108. Then, the vertical charge transfer register 108 sequentially transfers the signal charges to the horizontal charge transfer register 110. Upon receiving the signal charges from the individual vertical charge transfer registers 108, the horizontal charge transfer register 110 then transfers the signal charges to the output portion 112. The output portion 112 converts the signal charges into a voltage signal, amplifies it, and outputs the amplified signal.

In the solid-state imaging device 102, in order to obtain a higher level of resolution of captured images, the number of pixels should be increased. To achieve this, it is necessary to dispose more photoelectric conversion elements 106 on the semiconductor substrate 104. However, an increased number of photoelectric conversion elements 106 prolongs the time required for transferring the signal charge, and it becomes difficult to ensure the sufficient frame frequency required for displaying captured images.

In order to overcome the above-described drawback, a solid-state imaging device has been proposed in which the photoelectric conversion elements 106 are divided into two groups, which then transfer signal charges by using two horizontal charge transfer registers. FIG. 2 is a schematic diagram illustrating such a solid-state imaging device. In a solid-state imaging device 114 shown in FIG. 2, a photodetector region 105 on a semiconductor substrate is divided into first and second photodetector areas 116 and 118, and a plurality of photoelectric conversion elements disposed in a matrix are divided into a group disposed in the first photodetector area 116 and a group disposed on the second photodetector area 118. The signal charges generated by the photoelectric conversion elements in the first and second photodetector areas 116 and 118 are respectively transferred to first and second horizontal charge transfer registers 120 and 122 by using the corresponding vertical charge transfer registers. The photoelectric conversion elements and the vertical charge transfer registers are not shown in FIG. 2.

Upon receiving the signal charges from the vertical charge transfer registers, the first and second horizontal charge transfer registers 120 and 122 simultaneously transfer the signal charges in the opposite directions so as to supply them to first and second output portions 124 and 126, respectively, formed at the corresponding ends of the first and second horizontal charge transfer registers 120 and 122. Then, signals indicating images captured by the photoelectric conversion elements disposed in the first and second photodetector areas 116 and 118 are simultaneously output from the first and second output portions 124 and 126, respectively. Accordingly, in the solid-state imaging device 114, the time required for transferring the signal charge is decreased to one half the time for a solid-state imaging device using only one horizontal charge transfer register.

FIG. 3 is a plan view illustrating details of the first and second output portions 124 and 126 disposed at the corresponding ends of the first and second horizontal charge transfer registers 120 and 122, respectively, shown in FIG. 2.

The first and second output portions 124 and 126 respectively include first and second signal charge detectors 128 and 130, first and second transistors 132 and 134, and first and second charge sweeping regions 136 and 138.

Each of the first and second horizontal charge transfer registers 120 and 122 includes a transfer passage 140, which is, for example, an n-type region formed on the surface of a p-type semiconductor substrate, and transfer electrodes (not shown) disposed on the transfer passage 140 in the charge transfer direction. The transfer passage 140 is formed to be narrower, as shown in FIG. 3, as it goes to the end of each of the first and second horizontal charge transfer registers 120 and 122. Each of the first and second signal charge detectors 128 and 130 is formed as, for example, an n-type region on the surface of the semiconductor substrate, at the vicinity of the front end of the transfer passage 140.

Each of the first and second transistors 132 and 134 includes a gate 142, a source 144, and a drain 146. The gate 142 is formed of, for example, polysilicon, and is formed such that one end thereof overlaps with the corresponding signal charge detector 128 or 130. In this example shown in FIG. 3, the gate 142 of the first transistor 132 extends upward toward the upper left side, while the gate 142 of the second transistor 134 extends upward toward the upper right side. The source 144 and the drain 146 of each of the first and second transistors 132 and 134 are formed as, for example, n-type regions on the surface of the semiconductor substrate, across the gate 142.

Each of the first and second charge sweeping regions 136 and 138 includes, as shown in FIG. 3, a charge sweeping drain 150 and a charge sweeping control gate 152. The charge sweeping control gate 152 is disposed adjacent to the gate 142 of each of the first and second transistors 132 and 134, and the charge sweeping drain 150 is formed as, for example, an n-type region on the surface of the semiconductor, at a position opposite to the gate 142 across the charge sweeping control gate 152.

As shown in FIG. 3, the first signal charge detector 128, the first transistor 132, and the first charge sweeping region 136 are symmetrical to the second signal charge detector 130, the second transistor 134, and the second charge sweeping region 138, respectively, with respect to an imaginary line 154 drawn orthogonally to the direction in which the first and second horizontal charge transfer registers 120 and 122 are extended.

With this configuration, signal charges transferred from the first and second horizontal charge transfer registers 120 and 122 are converted into voltage signals having a magnitude according to the amount of charge by the first and second signal charge detectors 128 and 130, and the first and second transistors 132 and 134 amplify the voltage signals and output them from the drains 146.

The charge sweeping control gates 152 are controlled to be ON or OFF in synchronization with the charge transfer operation of the first and second horizontal charge transfer registers 120 and 122, and signal charges which have become unnecessary in the first and second signal charge detectors 128 and 130 are transferred to the charge sweeping drains 150 via the charge sweeping control gates 152.

The first and second transistors 132 and 134 and the first and second sweeping regions 136 and 138 which form the first and second output portions 124 and 126, respectively, are formed on a semiconductor substrate according to a known semiconductor processing technique, which has a plurality of steps. During the processing, a plurality of masks, such as photoresist or silicon nitride film, are formed in each step according to, for example, a photolithographic technique. As a result, the sources 144, the drains 146, and the gates 142 are formed in predetermined configurations at predetermined positions on the semiconductor substrate.

When a mask is formed by using, for example, a photoresist, according to a photolithographic technique, a photoresist film on a semiconductor substrate is exposed via a reticle, and is then developed so as to be formed into a mask pattern. Generally, however, the mask formed as described above is slightly displaced vertically, horizontally, to the left side, or to the right side from a correct position, on the mask surface within a predetermined allowance.

Accordingly, if, for example, a mask for forming the gate 142 of the first or second transistor 132 or 134 is slightly displaced with respect to a mask for forming the source 144 and a mask for forming the drain 146 of the corresponding transistor 132 or 134, the gate 142 is displaced from the correct position with respect to the source 144 and the drain 146. Such a displacement of the gate 142 adversely influences the characteristics of the corresponding transistor 132 or 134, which changes, for example, the degree of amplification of the transistor.

FIGS. 4A and 4B are partial plan views illustrating the gates 142 of the first and second transistors 132 and 134, respectively, which are formed slightly rightward from the correct positions due to displacements of the corresponding masks.

Since the mask for forming the gate 142 is displaced rightward, as shown in FIG. 4A, the gate 142 of the first transistor 132 is also formed rightward. As a consequence, the area of the drain 146 of the first transistor 132 is smaller than it should be, while the area of the source 144 is larger than it should be.

In contrast, as shown in FIG. 4B, since the gate 142 of the second transistor 134 is formed rightward, the area of the drain 146 is larger than it should be, while the source 144 is smaller than it should be.

Accordingly, such displacements of the masks from the correct positions change the characteristics of the first and second transistors 132 and 134 in different manners. For example, if the degree of amplification of one transistor is increased, the degree of amplification of the other transistor is decreased.

If the degree of amplification is different between the first and second transistors 132 and 134, the levels of the signals output from the first and second transistors 132 and 134 also become different. As a result, when captured images are displayed based on these signals, the brightness or the contrast becomes different between the left side and the right side of the screen.

The same applies to the first and second signal charge detectors 128 and 130, and the first and second charge sweeping regions 136 and 138. Thus, the levels of the signals output from the first and second output portions 124 and 126 become different.

SUMMARY OF THE INVENTION

Accordingly, in order to solve the above-described problem, it is an object of the present invention to provide a solid-state imaging device in which output portions provided for individual charge transfer registers can be formed without differentiating the electrical characteristics when transferring signal charges generated by photoelectric conversion elements in different directions by the charge transfer registers.

In order to achieve the above object, according to the present invention, there is provided a solid-state imaging device including: a plurality of photoelectric conversion elements; first and second charge transfer registers for transferring signal charges generated by the plurality of photoelectric conversion elements; first and second signal charge detectors, each being disposed in the vicinity of one edge of each of the first and second charge transfer registers, respectively; and first and second transistors. The above-described components are disposed on a semiconductor substrate. The first and second charge transfer registers transfer the signal charges in opposite directions. The first and second signal charge detectors receive the signal charges from the first and second charge transfer registers, respectively, and output voltages having a magnitude in accordance with the amount of charge. Each of the first and second transistors includes a gate into which the voltage output from the first or second signal charge detector is input, a source, and a drain, both of which are formed adjacent to the gate. The first signal charge detector, the source, the drain, and the gate of the first transistor are almost congruent to the second signal charge detector, the source, the drain, and the gate of the second transistor, respectively, when viewed from above. The first signal charge detector, the source, the drain, and the gate of the first transistor are overlaid almost completely on the second signal charge detector, the source, the drain, and the gate of the second transistor, respectively, by a translational movement.

DESCRIPTION OF THE PREFERRED EMBODIMENT

The present invention is described in detail below with reference to the accompanying drawings through illustration of a preferred embodiment.

Figure 1:
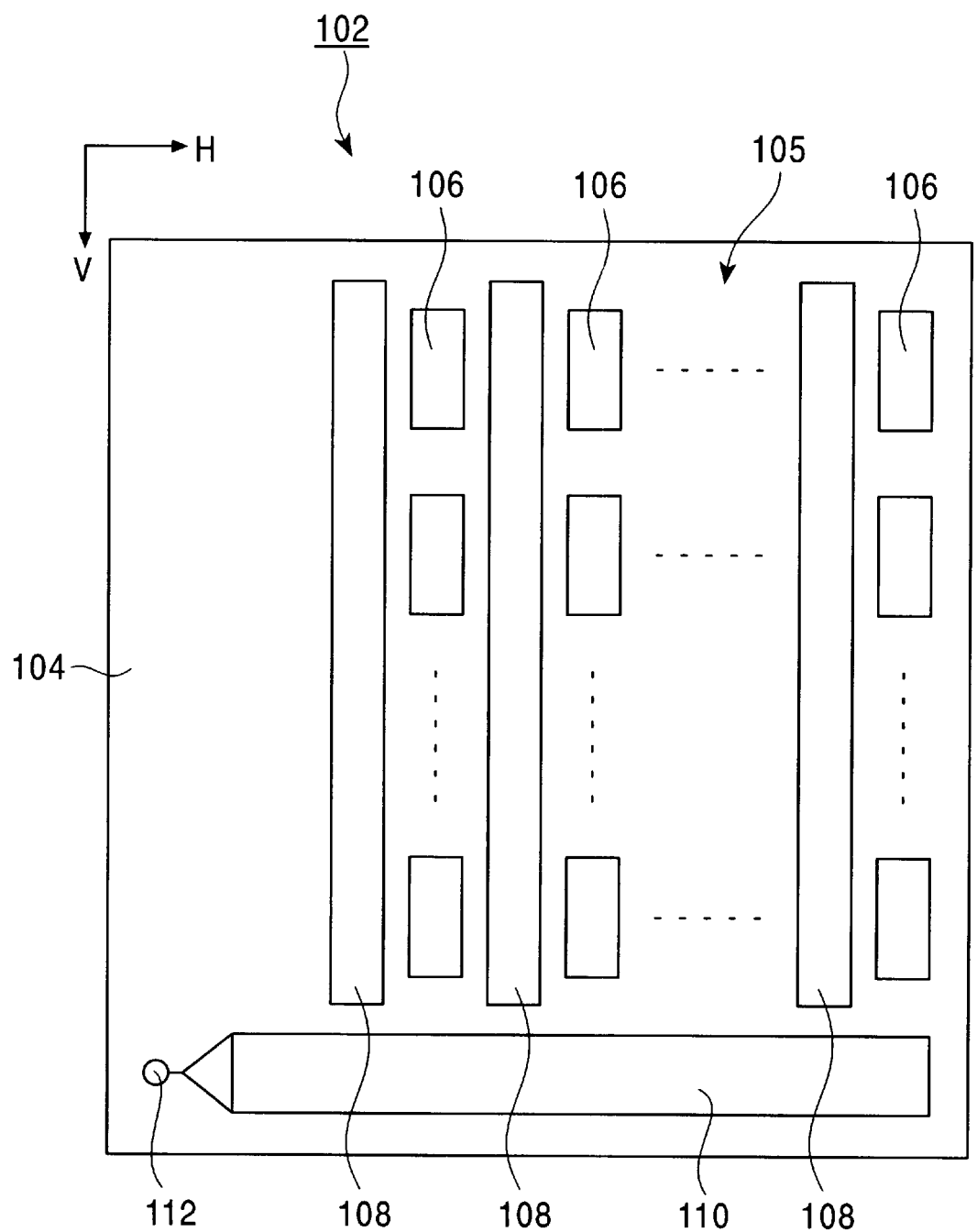
FIG. 1 is a plan view illustrating an example of a known solid-state imaging device.
Figure 2:
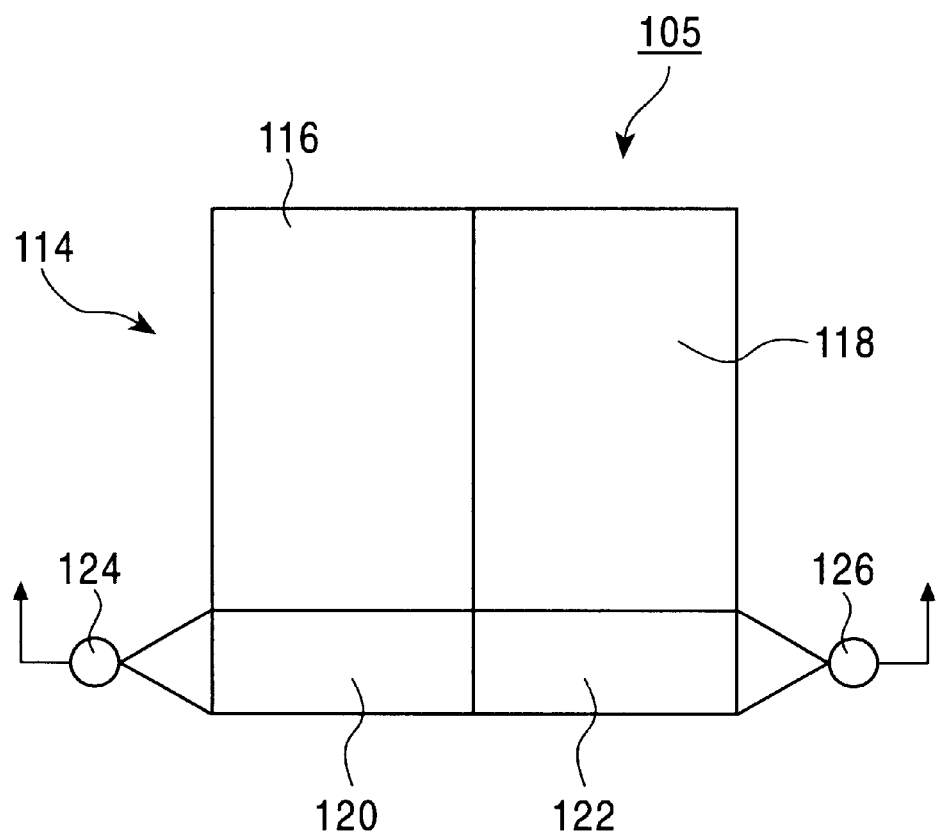
FIG. 2 is schematic diagram illustrating an example of a known solid-state imaging device in which photoelectric conversion elements are divided into two groups, and charges are transferred by using two horizontal charge transfer registers.
Figure 3:
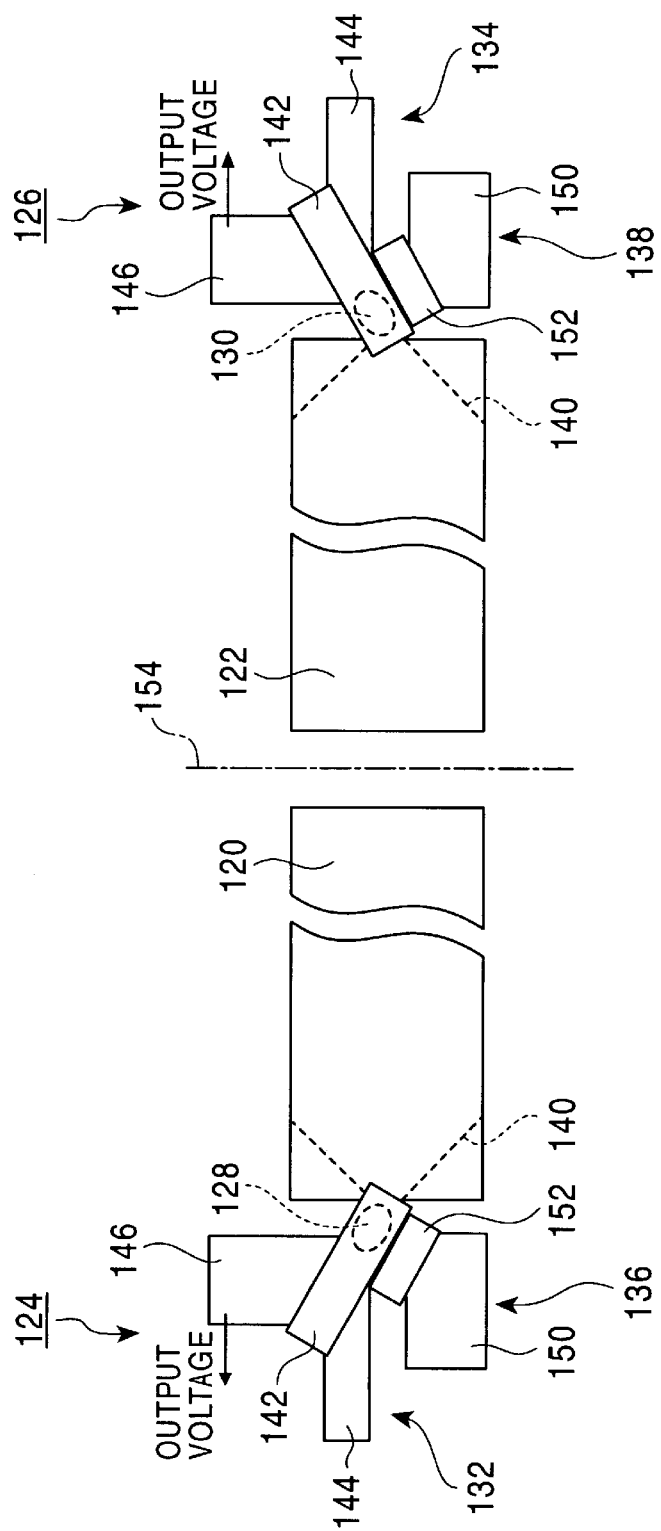
FIG. 3 is a plan view illustrating details of first and second output portions provided at the ends of the first and second horizontal charge transfer registers, respectively, shown in FIG. 2.
Figure 4A:
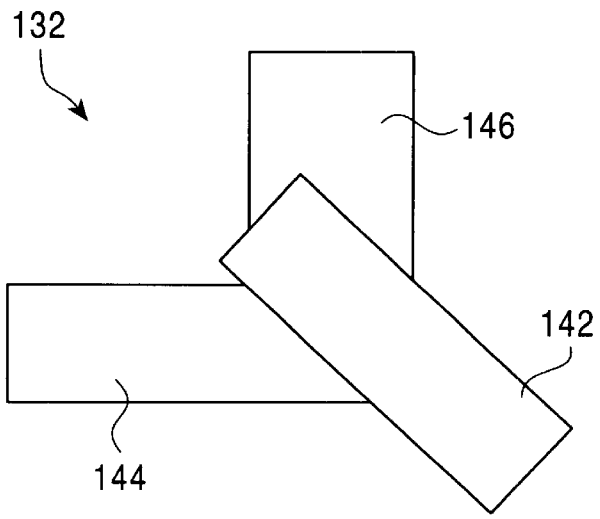
FIGS. 4A and 4B are partial plan views illustrating the gates of the first and second transistors, respectively, which are formed slightly rightward from the correct positions due to displacements of the corresponding masks.
Figure 4B:
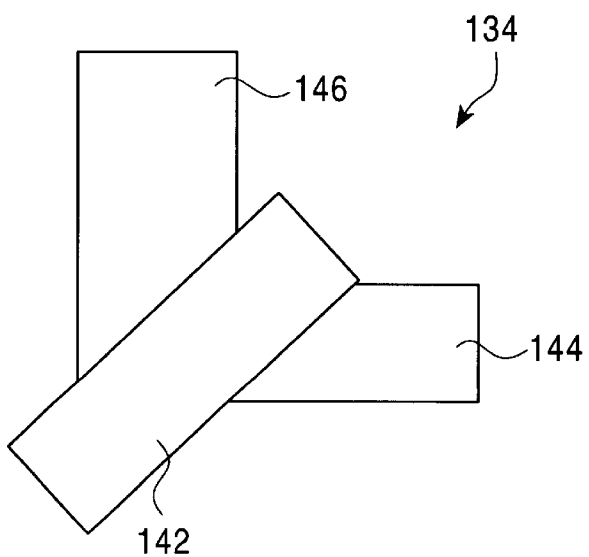
Figure 5:
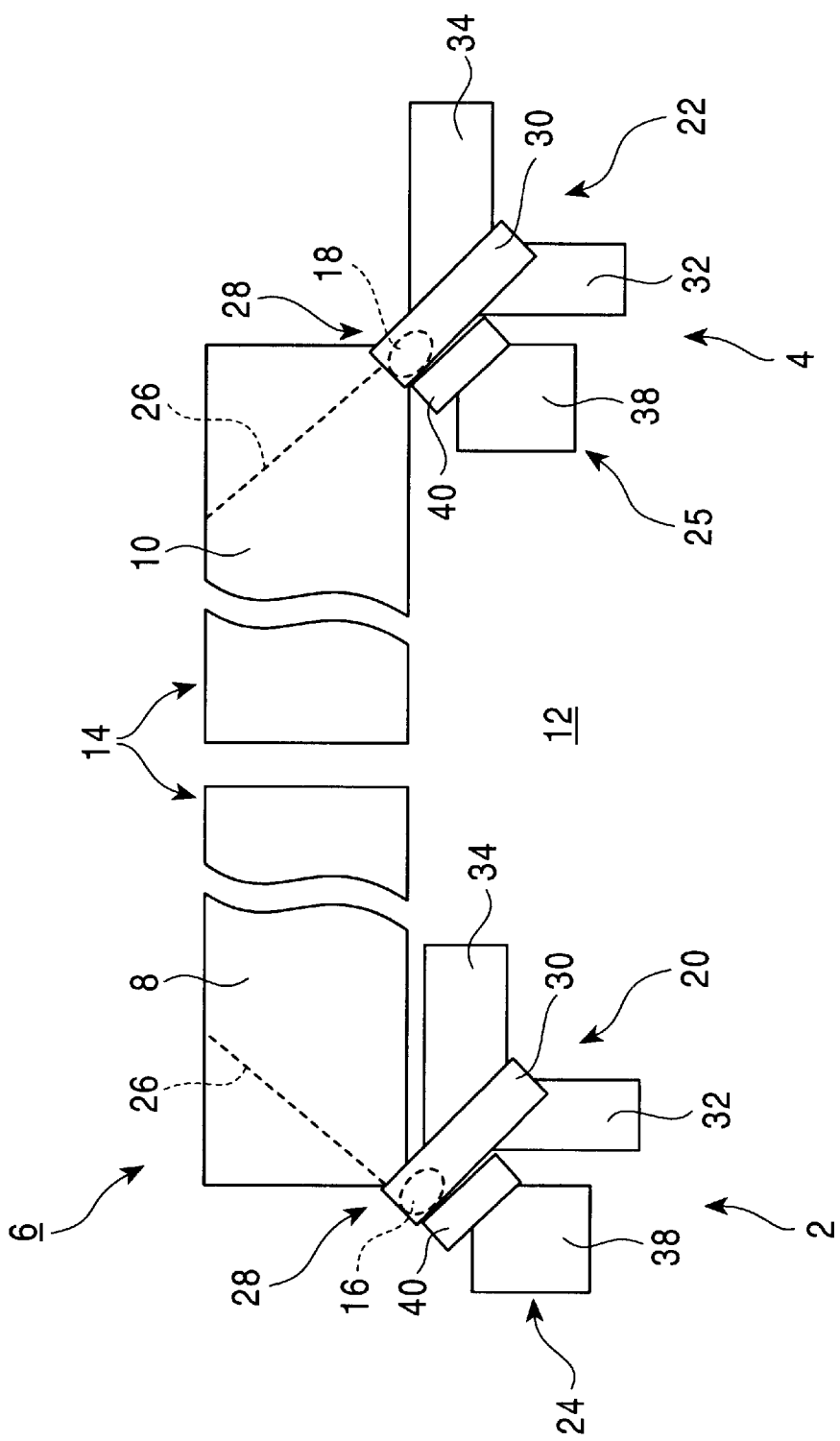
FIG. 5 is a partial plan view illustrating the essential portion of a solid-state imaging device according to an embodiment of the present invention.

FIG. 5 is a partial plan view illustrating the essential portion of a solid-state imaging device 6 according to an embodiment of the present invention. The configuration of the solid-state imaging device 6 is similar to that of the solid-state imaging device 114 shown in FIG. 2 in the arrangement of the photoelectric conversion elements and charge transfer registers. That is, in the solid-state imaging device 6, a plurality of photoelectric conversion elements are formed in a matrix with a gap therebetween on a silicon semiconductor substrate 12. A vertical charge transfer register is provided for each column of the photoelectric conversion elements in the vertical direction of the photoelectric conversion elements, and horizontal charge transfer registers are disposed at one end of the individual vertical charge transfer registers.

The photodetector region in which the photoelectric conversion elements are disposed are formed of first and second photodetector areas, and the horizontal charge transfer registers are formed of first and second horizontal charge transfer registers 8 and 10 provided for the first and second photodetector areas, respectively. The horizontal charge transfer registers 8 and 10 receive signal charges generated by the photoelectric conversion elements (first and second groups of photoelectric conversion elements) via the corresponding vertical charge transfer registers disposed in the first and second photodetector areas, and transfer the signal charges to corresponding first and second output portions 2 and 4.

The solid-state imaging device 6 is different from a known solid-state imaging device in the configuration of the first and second output portions 2 and 4. FIG. 5 illustrates details of the first and second output portions 2 and 4 and the components disposed around them.

As discussed above, the solid-state imaging device 6 includes the first and second horizontal charge transfer registers 8 and 10, which are disposed on the same imaginary line on the semiconductor substrate 12 such that signal charges are transferred in parallel to the imaginary line, and that one end of the first horizontal charge transfer register 8 opposedly faces one end of the second horizontal charge transfer register 10 (such opposing ends of the first and second horizontal charge transfer registers 8 and 10 are indicated by 14).

The first and second output portions 2 and 4 are formed at the ends opposite to the opposing ends 14 of the first and second horizontal charge transfer registers 8 and 10, respectively. The first and second output portions 2 and 4 include first and second signal charge detectors 16 and 18, first and second transistors 20 and 22, and first and second charge sweeping regions 24 and 25, respectively. The signal charges are supplied to the first and second horizontal charge transfer registers 8 and 10 via the corresponding vertical charge transfer registers (not shown), and are then transferred in the opposite directions, i.e., toward the first and second output portions 2 and 4.

Each of the first and second horizontal charge transfer registers 8 and 10 includes a transfer passage 26, which is, for example, an n-type region formed on the surface of the p-type semiconductor substrate 12, and a plurality of transfer electrodes (not shown) disposed on the transfer passage 26 in the charge transfer direction. The transfer passage 26 is, as shown in FIG. 5, formed in a configuration such that the end thereof close to each of the first and second signal charge detectors 16 and 18 is formed obliquely across the charge transfer direction when viewed from above. The first and second signal charge detectors 16 and 18 are formed adjacent to front ends 28 of the first and second horizontal charge transfer registers 8 and 10, respectively. The first and second signal charge detectors 16 and 18 are formed as n-type regions on the surface of the semiconductor substrate 12.

In this embodiment, the first and second transistors 20 and 22 forming the first and second output portions 2 and 4, respectively, are MOS transistors, and each includes a gate 30, a source 32, and a drain 34. The gates 30 of the first and second transistors 20 and 22 are formed of, for example, polysilicon, and are disposed so that one end of each gate 30 overlaps with the first and second signal charge detector 16 or 18. In this embodiment, the gates 30 of the first and second transistors 20 and 22 extend downward toward the bottom right with the same tilting angle, and the configuration of the gate 30 of the first transistor 20 is almost congruent to that of the second transistor 22 when viewed from above. Accordingly, if the gate 30 of the first transistor 20 is translationally moved toward the gate 30 of the second transistor 22, it almost coincides with the gate 30 of the second transistor 22.

The source 32 and the drain 34 are formed across the gate 30 as, for example, an n-type region on the surface of the semiconductor substrate 12. The configurations of the source 32 and the drain 34 of the first transistor 20 are almost congruent to those of the second transistor 22 when viewed from above. Accordingly, the source 32 and the drain 34 of the first transistor 20 are overlaid almost completely on those of the second transistor 22 by a translational movement.

Each of the first and second charge sweeping regions 24 and 25 includes, as shown in FIG. 5, a charge sweeping drain 38 and a charge sweeping control gate 40, which is formed of, for example, polysilicon. The charge sweeping control gate 40 is disposed adjacent to the gate 30 of each of the first and second transistors 20 and 22. The charge sweeping drain 38 is formed as, for example, an n-type region on the surface of the semiconductor substrate 12, at a position opposite to the gate 30 across the charge sweeping control gate 40.

The charge sweeping control gate 40 and the charge sweeping drain 38 of the first charge sweeping region 24 are almost congruent to those of the second charge sweeping region 25 when viewed from above. Accordingly, the charge sweeping control gate 40 and the charge sweeping drain 38 of the first charge sweeping region 24 are overlaid almost completely on those of the second charge sweeping region 25 by a translational movement.

With this configuration, signal charges transferred from the first and second horizontal charge transfer registers 8 and 10 are converted into voltage signals having a magnitude according to the amount of charge by the first and second signal charge detectors 16 and 18, respectively, and the first and second transistors 20 and 22 amplify the voltage signals and output them from the corresponding drains 34.

The charge sweeping control gates 40 are controlled to be ON or OFF in synchronization with the charge transfer operation of the first and second horizontal charge transfer registers 8 and 10, and signal charges which have become unnecessary in the first and second signal charge detectors 16 and 18 are transferred to the charge sweeping drains 38 via the charge sweeping control gates 40.

As described above, in the solid-state imaging device 6, the first signal charge detector 16, the source 32, the drain 34, and the gate 30 of the first transistor 20, and the first charge sweeping region 24 are almost congruent to the second charge detector 18, the source 32, the drain 34, and the gate 30 of the second transistor 22, and the second charge sweeping region 25. Additionally, the first signal charge detector 16, the source 32, the drain 34, and the gate 30 of the first transistor 20, and the first charge sweeping region 24 are overlaid almost completely on the second charge detector 18, the source 32, the drain 34, and the gate 30 of the second transistor 22, and the second charge sweeping region 25 by a translational movement. Thus, even if a mask for forming the above-described component is slightly displaced from the correct position, the levels of the signals output from the first and second transistors 20 and 22 do not become different.

This is explained in greater detail below in the context of the first and second transistors 20 and 22. The positions and configurations of the sources 32 and the drains 34 of the first and second transistors 20 and 22 are determined by the positions and configurations of the components formed around the sources 32 and the drains 34, for example, field oxide film. The gate 30 is fabricated by forming a mask with the use of photoresist which will be opened at the corresponding position of the gate 30 and by depositing polysilicon in the opened portion. If the mask for forming the gate 30 is slightly displaced with respect to the mask for forming the field oxide film, the gate 30 is slightly displaced from the correct position with respect to the source 32 and the drain 34.

If the mask 30 is displaced, for example, slightly rightward in FIG. 5, the area of the drain 34 is smaller than it should be, and the area of the source 32 is larger than it should be. However, since the gate 30, the source 32, and the drain 34 of the first transistor 20 are formed almost congruent to those of the second transistor 22, and since the above-described elements of the first transistor 20 are overlaid almost completely on the corresponding elements of the second transistor 22 by a translational movement, the amount by which the drain 34 is decreased due to a displacement of the gate 30 is almost the same between the first and second transistors 20 and 22, and an amount by which the source 32 is increased is almost the same between the first and second transistors 20 and 22.

Accordingly, although the characteristics of the first and second transistors 20 and 22 change due to a displacement of the gates 30, they change in a similar manner. Thus, there is no difference between the levels of the signals output from the first and second transistors 20 and 22.

The same applies to the first and second signal charge detectors 16 and 18 and the first and second charge sweeping regions 24 and 25. Since the first signal charge detector 16 and the first charge sweeping region 24 are formed almost congruent to the second signal charge detector 18 and the second charge sweeping region 25, and since the first signal charge detector 16 the first charge sweeping region 24 are overlaid almost completely on the second signal charge detector 18 and the second charge sweeping region 25 by a translational movement, there is no difference in the electrical characteristics even if a mask is displaced during the manufacturing process, and thus, the level of the output signal from the first output portion 2 is not different from that from the second output portion 4.

When images captured by the solid-state imaging device 6 are displayed, for example, on a display device according to the output signals of the first and second transistors 20 and 22, there is no difference in the brightness and the contrast between the left side and the right side of the screen, even though the two horizontal charge transfer registers 8 and 10 are used.

In this embodiment, as shown in FIG. 5, the first and second output portions 2 and 4 are formed under the first and second horizontal charge transfer registers 8 and 10, respectively. However, the first and second output portions 2 and 4 may be disposed at any position as long as the components of the output portions 2 and 4 are formed almost congruent with each other and they are overlaid almost completely on each other by a translational movement, in which case, advantages similar to those achieved by this embodiment can be obtained.

Although in this embodiment the photoelectric conversion elements are disposed in a matrix, they may be linearly disposed, as in a linear image sensor, in which case, signal charge generated by the photoelectric conversion elements are transferred by two or more charge transfer registers.

What is claimed is:

1. A solid-state imaging device comprising:

a plurality of photoelectric conversion elements disposed on a semiconductor substrate;

first and second charge transfer registers disposed on said semiconductor substrate, for transferring signal charges generated by said plurality of photoelectric conversion elements;

first and second signal charge detectors disposed on said semiconductor substrate, each of said first and second signal charge detectors being disposed in the vicinity of one edge of each of said first and second charge transfer registers, respectively; and first and second transistors disposed on said semiconductor substrate, wherein: said first and second charge transfer registers transfer the signal charges in opposite directions; said first and second signal charge detectors receive the signal charges from said first and second charge transfer registers, respectively, and output voltages having a magnitude in accordance with the amount of charge; each of said first and second transistors includes a gate into which the voltage output from said first or second signal charge detector is input, a source, and a drain, the source and the drain being formed adjacent to the gate; and said first signal charge detector, the source, the drain, and the gate of said first transistor are almost congruent to said second signal charge detector, the source, the drain, and the gate of said second transistor, respectively, when viewed from above, said first signal charge detector, the source, the drain, and the gate of said first transistor being overlaid almost completely on said second signal charge detector, the source, the drain, and the gate of said second transistor, respectively, by a translational movement.

2. A solid-state imaging device according to claim 1, wherein: each of said first and second charge transfer registers includes a transfer passage disposed on a surface of said semiconductor substrate, and a plurality of transfer electrodes disposed on said transfer passage in a charge transfer direction; said transfer passage is configured such that the end thereof close to each of said first and second signal charge detectors is formed obliquely across the charge transfer direction when viewed from above; and said first and second signal charge detectors are disposed in the vicinity of front ends of the edges of said first and second charge transfer registers, respectively.

3. A solid-state imaging device according to claim 1, wherein: said plurality of photoelectric conversion elements are disposed in a matrix on said semiconductor substrate; a vertical charge transfer register is formed on said semiconductor substrate for each column of the photoelectric conversion elements; the signal charges generated by said photoelectric conversion elements of the individual columns are transferred by the corresponding vertical charge transfer registers; said plurality of photoelectric conversion elements are divided into first and second groups; said first and second charge transfer registers are provided as first and second horizontal charge transfer registers for the first group of the photoelectric conversion elements and the second group of the photoelectric conversion elements, respectively; and said first and second horizontal charge transfer registers respectively receive the signal charges generated by the first group of the photoelectric conversion elements and the second group of the photoelectric conversion elements from the corresponding vertical charge transfer registers, and transfer the signal charges to said first and second signal charge detectors, respectively.

4. A solid-state imaging device according to claim 3, wherein said first and second horizontal charge transfer registers are formed on an identical imaginary line on said semiconductor substrate such that one edge of said first horizontal charge transfer register opposedly faces one edge of said second horizontal charge transfer register.

5. A solid-state imaging device according to claim 4, wherein said first signal charge detector and said first transistor are formed at an edge opposite to the edge facing said second horizontal charge transfer register, and said second signal charge detector and said second transistor are formed at an edge opposite to the edge facing said first horizontal charge transfer register.

6. A solid-state imaging device according to claim 1, wherein said first and second transistors are MOS transistors.

7. A solid-state imaging device according to claim 1, further comprising first and second charge sweeping regions formed on the surface of said semiconductor substrate adjacent to said first and second transistors, respectively, said first and second charge sweeping regions including charge sweeping control gates formed adjacent to the gates of said first and second transistors, respectively, and charge sweeping drains formed at positions opposite to the gates of said first and second transistors, respectively, across the charge sweeping control gates, wherein the charge sweeping control gate and the charge sweeping drain of said first charge sweeping region are almost congruent to the charge sweeping control gate and the charge sweeping drain of said second charge sweeping region as viewed from above, and the charge sweeping control gate and the charge sweeping drain of said first charge sweeping region are overlaid almost completely on the charge sweeping control gate and the charge sweeping drain of said second charge sweeping region by a translational movement.

* * * * *